United States Patent
Seki

(10) Patent No.: US 8,685,306 B2
(45) Date of Patent: Apr. 1, 2014

(54) MOLDING APPARATUS AND MOLDING METHOD

(75) Inventor: Junichi Seki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 843 days.

(21) Appl. No.: 12/238,617

(22) Filed: Sep. 26, 2008

(65) Prior Publication Data
US 2009/0032998 A1    Feb. 5, 2009

Related U.S. Application Data

(62) Division of application No. 11/059,330, filed on Feb. 17, 2005, now Pat. No. 7,442,028.

(30) Foreign Application Priority Data

Feb. 20, 2004 (JP) .................. 2004-044726

(51) Int. Cl.
*B29C 59/00* (2006.01)
(52) U.S. Cl.
USPC ....................................... 264/293
(58) Field of Classification Search
USPC .................. 264/293; 425/112, 385
See application file for complete search history.

(56) References Cited

U.S. PATENT DOCUMENTS

| 7,347,683 B2 | 3/2008 | Seki et al. ............. 425/182 |
| 2003/0189273 A1* | 10/2003 | Olsson ............... 264/293 |
| 2004/0131718 A1* | 7/2004 | Chou et al. ............ 425/385 |
| 2004/0182820 A1 | 9/2004 | Motowaki et al. |
| 2004/0183236 A1 | 9/2004 | Ogino et al. |
| 2005/0064054 A1* | 3/2005 | Kasumi ............. 425/112 |

FOREIGN PATENT DOCUMENTS

JP   11-33800   2/1999

OTHER PUBLICATIONS

H. Hiroshima, et al., "Uniformity in Patterns Imprinted Using Photo-Curable Liquid Polymer", J. Applied Physics, vol. 41, pp. 4173-4177 (Jun. 2002).

* cited by examiner

*Primary Examiner* — Larry Thrower
(74) *Attorney, Agent, or Firm* — Fitzpatrick, Cella, Harper & Scinto

(57) ABSTRACT

A molding apparatus for patterning a workpiece includes a first support member for supporting the mold, a second support member arranged opposite to the first support member, and a pressing mechanism for pressing the mold and the work together using the support members to pattern the workpiece. In this structure, either the surface of the first support member for supporting the mold or the surface of the second support member for supporting the workpiece is smaller in area than both surfaces of the mold and the workpiece.

7 Claims, 5 Drawing Sheets

MOLDING APPARATUS AND MOLDING METHOD

This is a divisional of application Ser. No. 11/059,330, filed on Feb. 17, 2005.

BACKGROUND OF THE INVENTION

1. Field of the Invention

The present invention relates to a press molding apparatus and a press molding method, for transferring the features of a mold to a workpiece under the application of pressure.

2. Description of the Related Art

In recent years, micro-fabrication technology for press transferring fine structures on a mold to a workpiece, such as resin or metal, have been developed and become a focus of attention. This technology, called nano-imprint or nano-embossing, has a resolution on the order of several nanometers. In addition, it can mold 3D structures on a wafer by one operation. For these reasons, this technology is expected to be applicable to a wide variety of fields, such as the next-generation semiconductor fabrication, the fabrication of optical elements like photonic crystals, and the fabrication of biochips such as µ-TAS chips.

Japanese patent laid-open application No. Hei 11(1999)-033800 proposes a method of pressing a mold into a resist on a semiconductor wafer to create an imprint pattern so as to produce a pattern on the semiconductor wafer through the process of ion milling.

An article, "Uniformity in Patterns Imprinted Using Photo-Curable Liquid Polymer" by Hiroshi Hiroshima, et al, *Jpn. J. Appl. Phys.* Vol. 41 (2002) 4173-4177, also proposes a method in which a sapphire block is used to press a mold smaller in area than the block, and expose it to UV rays to cure UV curing resin so as to produce a pattern.

The following describes problems in the above-mentioned molding technology with reference to FIG. 5.

FIG. 5 shows a typical example of the structure of the prior art technology. A mold 106 is typically micro-fabricated on a wafer of Si or $SiO_2$ by EB lithography, FIB, X-ray lithography, etc, or replicated by Ni electroforming. A workpiece, or work, 107 is typically an Si semiconductor wafer coated with resin, or a resin plate. The mold 106 and the work 107 are sandwiched between a mold pressing member 104 and a work pressing member 109, and pressed together by means of a press mechanism (not shown). The mold 106 and the work 107 are held typically by evacuating air (110) from grooves or holes provided in each pressing member.

In this structure, since the mold 106 is smaller in area than the mold pressing member 104, the work 107, and the work pressing member 109, the molding force is concentrated around the periphery of the mold 106 and gradually reduced to the center portion. The above-mentioned wafer is thin, with a thickness of 1 mm or less. Therefore, the uneven distribution of molding force almost directly affects the contact surface of the mold 106 and the work 107, causing an unevenness of processed depths. Further, the mold force is also reduced around the grooves or holes provided for evacuating air 110 for the same reason.

Such a structure is likely to cause stress concentration at the edges of the mold 106. The above-mentioned wafer material such as Si or $SiO_2$ is fragile or brittle, and in many cases, a brittle fracture starts from a point of the wafer material. Further, the point at which the brittle fracture started also hastens the damage to the pressing part, increasing maintenance costs.

SUMMARY OF THE INVENTION

In order to solve the above-mentioned problems, the present invention uses the following means.

That is, according to the present invention, there is provided a molding apparatus for patterning a workpiece using a mold. The apparatus includes a first support member for supporting the mold, a second support member, arranged opposite to the first support member, for supporting the workpiece between the first support member and the second support member itself, and a pressing mechanism for pressing the mold and the workpiece together to bring the mold and the workpiece in contact with each other so as to pattern the workpiece.

In this structure, at least either the surface of the first support member for supporting the mold or the surface of the second support member for supporting the workpiece is smaller in area than both of the mold and the workpiece.

In another aspect of the present invention, there is provided a molding apparatus for transferring the recessed and raised features of a mold to a workpiece. The apparatus includes a first support member for supporting the mold, and a second support member, arranged opposite to the first support member, for supporting the workpiece.

In this structure, the surface of the first support member on the mold side is smaller in area than the surfaces of the mold and the workpiece, and the surface of the second support member on the workpiece side is smaller in area than the surfaces of the mold and the workpiece.

In yet another aspect of the present invention, there is provided a molding apparatus for transferring the recessed and raised features of a mold to a workpiece. The apparatus includes a first support member for supporting the mold, and a second support member, arranged opposite to the first support member, for supporting the workpiece.

In this structure, the surface of the first support member on the mold side is smaller in area than the surface of the mold on the first support member side, and the surface of the first support member on the mold side and the surface of the second support member on the workpiece side are substantially the same as each other.

The "substantially the same" means not only the same shape, but also similar shapes between which there is a difference within 10 percent, preferably 5 percent, and further preferably within 2 percent. Even when the first and second support members have the same shape (same area), it is preferable that the area be smaller than that of the mold.

Further features and advantages of the present invention will become apparent from the following description of exemplary embodiments (with reference to the attached drawings).

DESCRIPTION OF THE EMBODIMENTS

In preferred embodiments of the present invention, any of the above-mentioned structures is applied in such a manner that at least either of the press surface of the first support member and the press surface of the second support member is made smaller in area than both of a mold and a work. Therefore, since pressure is applied to an inner area smaller in area than the outside circumference of each of the mold and the work, stress concentration around the outside circumference of the mold or the work can be prevented or at least reduced, reducing the possibility of damage not only to the mold and the work but to the press members.

Further, if both of the press surfaces are made equal in outer dimensions to each other and placed axially so that the press surfaces will be symmetric to the contact surface of the mold and the work, the deformation of the mold and the work can be prevented, thereby further preventing the damage to the mold and the work. In addition, if the press members are made in the form of columns, the uniformity of molding force can be improved, enabling the patterning of the work with an even depth.

Furthermore, if a holding member with a low Young's modulus is provided on the outside of work surface so that the work will be held by reducing pressure between the press member and the hold member, the mold and the work can be held without hardly affecting the distribution of molding force. This improves the evenness of the molding force, enabling the patterning of the work with an even depth. Since the holding member with a low Young's modulus is provided so that the work will be held by reducing pressure between the press member and the hold member, the mold and the work can be held while maintaining the evenness of the molding force.

First Embodiment

The first embodiment of the present invention will now be described with reference to FIGS. 1 and 2.

Figure 1:
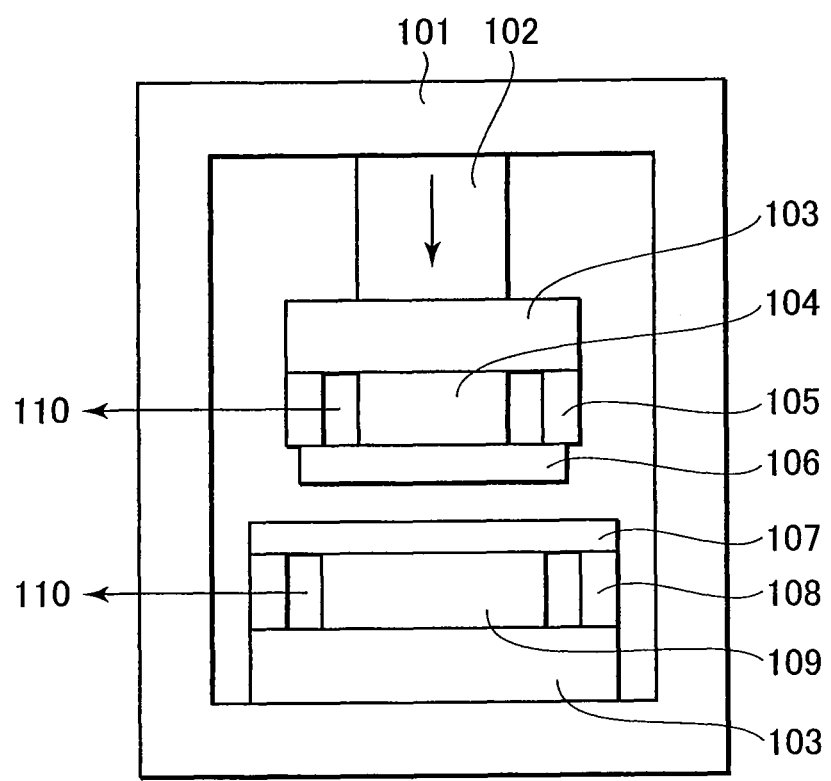
FIG. 1 is a cross sectional view for explaining the structure of an apparatus according to a first embodiment of the present invention.
Figure 2:
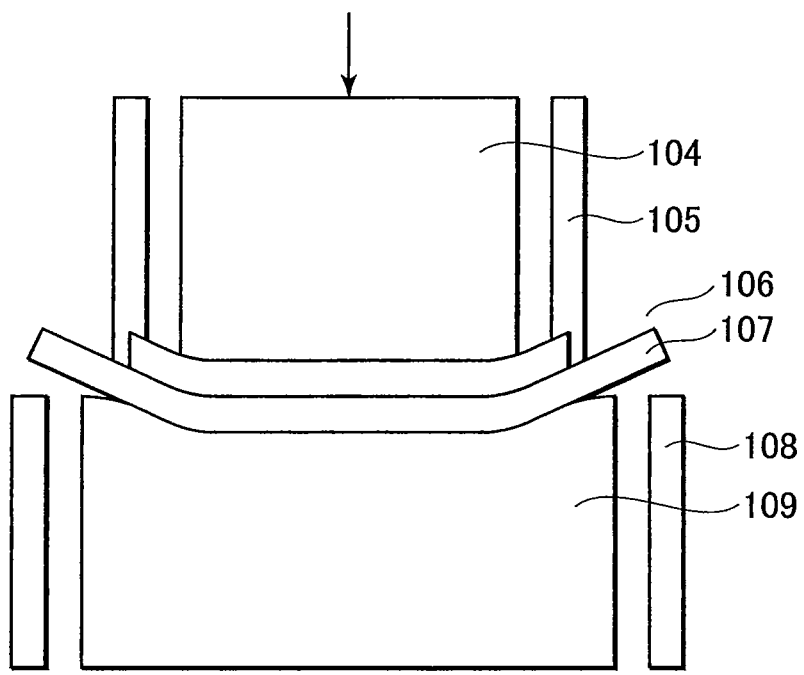
FIG. 2 is a cross sectional view for explaining a pressed state in the structure according to the first embodiment of the present invention.
Figure 2:
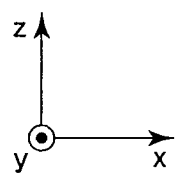

As shown in FIG. 1, the mold 106 is arranged opposed (or opposite) to a work (workpiece) 107 made by coating resin on an Si wafer. The mold pressing member (first support member) 104 and the work pressing member (second support member) 109 are surrounded with a space by a mold holding member 105 and a work holding member 108, respectively. Air is evacuated (110) from the space to hold the mold 106 and the work 107. Both of the pressing members are connected to each other through press part support members 103, a press mechanism 102, and an apparatus frame or casing 101 that receives a reactive force from the press mechanism 102. The press mechanism 102 applies pressure between the mold 106 and the work 107 using a pneumatic cylinder to transfer the surface features of the mold 106 into the resin on the work 107. The material of each member is steel or stainless steel unless otherwise noted. In FIG. 1, the press mechanism 102 moves the mold, but it may move the work, or both.

In the embodiment, since the mold 106 has a circular surface smaller in area than that of the work 107, the mold pressing member 104 is also made in the form of a cylinder smaller in diameter than the mold 106. The work pressing member 109 is made in the form of a cylinder, the diameter of which is smaller than that of the work 107 but larger than that of the mold pressing member 104. When both pressing members are arranged to opposed each other with respect to the pressing axis, it is particularly preferable that press surfaces of both pressing members or cross-sectional planes nominal to the pressing axis have a plane symmetry. FIG. 2 shows a state in which press molding is carried out using the above-mentioned structure. In this case, stress concentration at the edges of the mold 106 and the work 107 can be avoided, preventing brittle fracture starting from these edges. This structure can also reduce the unevenness of molding force caused by providing holes or grooves for evacuating air 110. Further, the material of the mold holding member 105 and the work holding member 108 has a Young's modulus low enough to have little effect on the distribution of the molding force.

In the disclosed embodiment, cylinder-shaped pressing members are used, but any other shape is selectable as appropriate, such as the shape of a quadratic prism or a circular pipe, depending on the shape of the mold 106 or the work 107, or the shape of a molded area. Further, the mold holding member 105 and the work holding member 108 are made of resin, but any other structure can be adopted as long as it has little effect on the distribution of molding force, such as a metal ring pressed by a spring.

Second Embodiment

The second embodiment of the present invention will now be described with reference to FIGS. 3 and 4.

Figure 3:
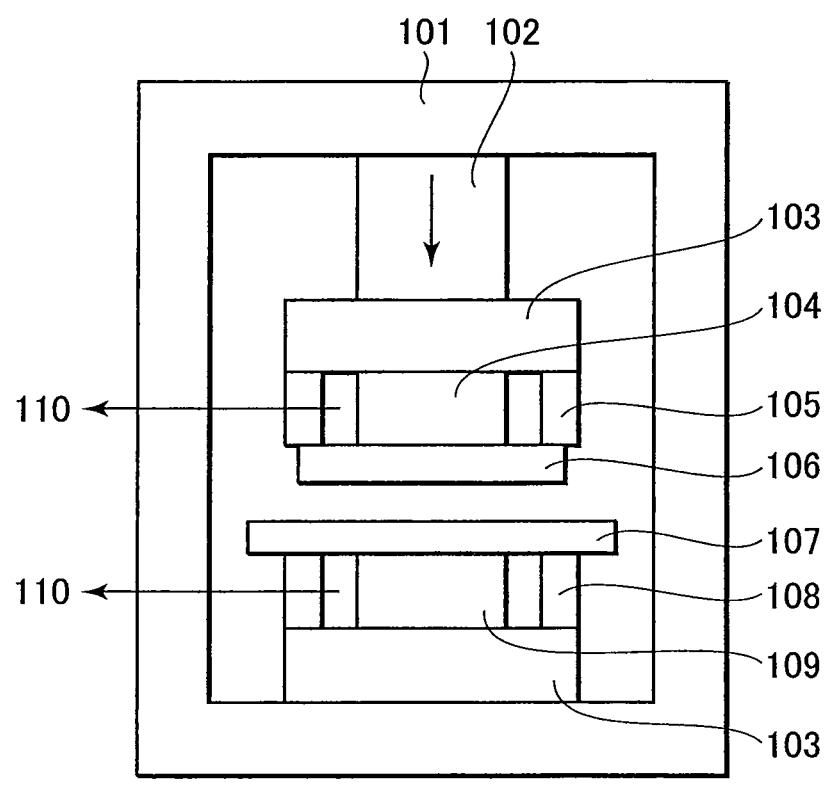
FIG. 3 is a cross sectional view for explaining the structure of an apparatus according to a second embodiment of the present invention.
Figure 3:
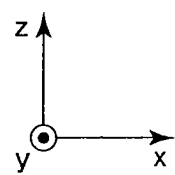
Figure 4:
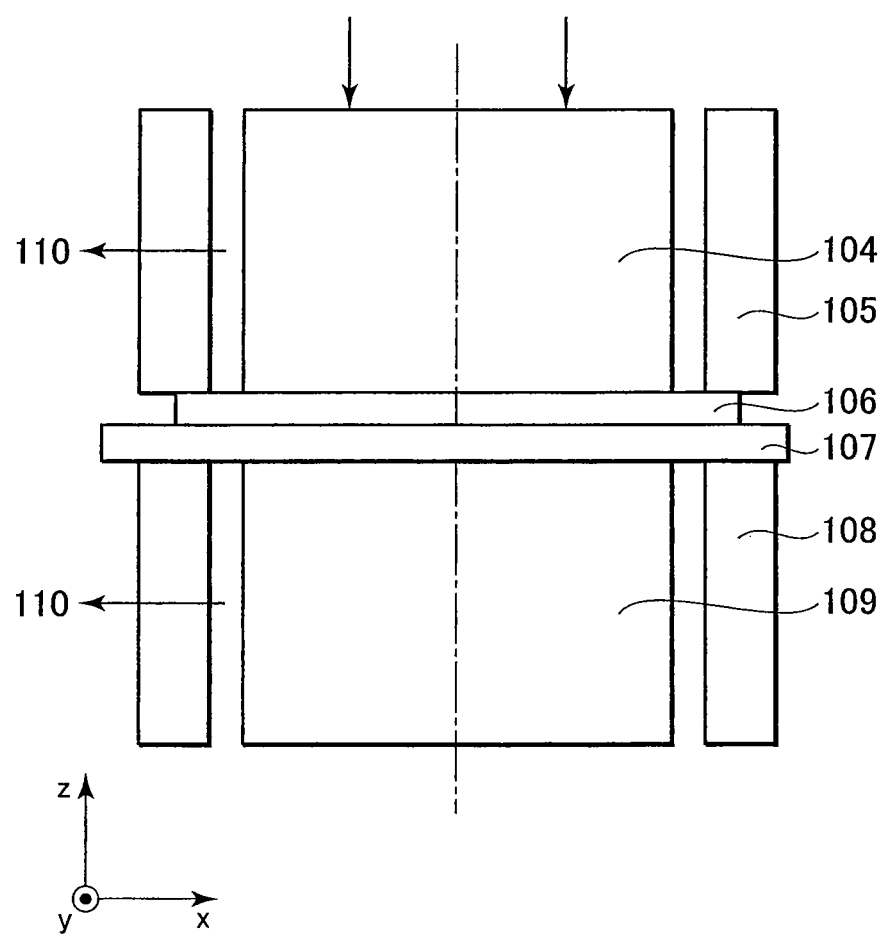
FIG. 4 is a cross sectional view for explaining a pressed state in the structure according to the second embodiment of the present invention.
Figure 5:
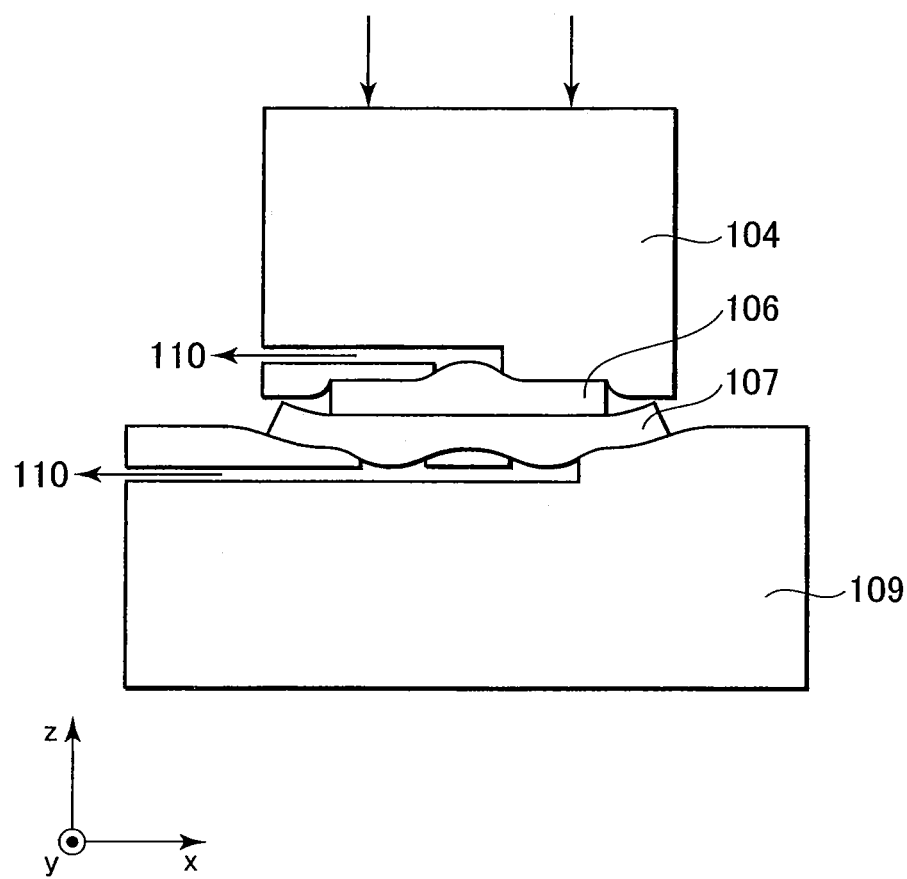
FIG. 5 is a cross sectional view for explaining the problems of the prior art technology.

As shown in FIG. 3, the mold 106 is arranged to opposed the work 107, which is made by coating resin on an Si wafer. The mold pressing member 104 and the work pressing member 109 are surrounded with a space by the mold holding member 105 and the work holding member 108, respectively, made of fluorocarbon resin. Air is evacuated (110) from the space to hold the mold 106 and the work 107. Both of the pressing members are connected to each other through the press part support members 103, the press mechanism 102, and the casing 101 that receives a reactive force from the press mechanism 102. The press mechanism 102 applies pressure between the mold 106 and the work 107 using a pneumatic cylinder to transfer the surface features of the mold 106 into the resin on the work 107. The material of each member is steel or stainless steel unless otherwise noted.

In the embodiment, since the mold 106 has a smaller circular area than the work 107, the mold pressing member 104 and the work pressing member 109 are also made in the form of cylinders smaller in diameter than the mold 106, and axially arranged. To be more specific, both of the pressing members are in the form of cylinders of 20 mm in diameter and 30 mm in height with respect to the mold of 25 mm in diameter, respectively. FIG. 4 shows a state in which press molding is carried out using the above-mentioned structure. In this case, stress concentration at the edges of the mold 106 and the work 107 can be reduced or even avoided, preventing brittle fracture starting from these edges. This structure can also reduce the unevenness of molding force caused by providing holes or grooves for evacuating air 110. Further, the material of the mold holding member 105 and the work holding member 108 has a Young's modulus low enough to have little or no effect on the distribution of the molding force.

Furthermore, since the distribution of the molding force in this structure comes very close to the axial stress distribution on the cross-sectional planes nominal to the pressing axis when the cylinders are pressed together in the axial direction, a very even stress distribution can be obtained even when the pressing members have a high Young's modulus. For example, if the mold and the work are an Si wafer of 1 mm thick, respectively, and are pressed by the pressing members made of steel, the distribution of the molding force can be reduced to about 5 percent. This structure is particularly suitable for high-precision fabrication.

Although in the disclosed embodiment cylinder-shaped press members are used, but any other shape is selectable depending on the shape of the mold 106 or the work 107, or the shape of a molded area. For example, a quadratic prism or cylinder for patterning a recording medium, or a cylinder having a hole in the center for patterning a recording medium may be selected. Further, although in the embodiment the mold holding member 105 and the work holding member 108 are made of resin, any other structure can be adopted as long as it has little effect on the distribution of molding force, such as, for example, a metal ring pressed by a spring.

While the present invention has been described with reference to exemplary embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. 2004-044726 filed Feb. 20, 2004, which is hereby incorporated by reference herein.

What is claimed is:

1. A molding method of patterning a workpiece using a mold, comprising the steps of:
   directly attaching the mold to a first support member for supporting the mold;
   attaching the workpiece to a second support member for supporting the workpiece; and
   bringing the first and second support members toward each other with a pressing force to press a patterned surface of the mold and a work surface of the workpiece together so as to pattern the workpiece,
   wherein the first support member has a first contact surface in direct contact with the mold, and
   the second support member has a second contact surface, and
   wherein an entire outer periphery of the first contact surface and the second contact surface are smaller in outer dimension than contact surfaces of the mold and the workpiece, respectively, and
   wherein the pressing force is transmitted through the first contact surface between the first support member and the mold and the second contact surface between the second support member and the workpiece.

2. The molding method according to claim 1, wherein the first press surface and the second press surface are arranged opposite to each other along a press axis and have a plane symmetry.

3. The molding method according to claim 1, wherein the first or second support member is provided with a holding member at its periphery.

4. The molding method according to claim 3, wherein the holding member is a material with a Young's modulus low enough to reduce a pressing force.

5. A molding method of patterning a workpiece using a mold, comprising the steps of:
   directly attaching the mold to a first support member for supporting the mold;
   attaching the workpiece to a second support member for supporting the workpiece; and
   bringing the first and second support members toward each other with a pressing force to press a patterned surface of the mold and a work surface of the workpiece together so as to pattern the workpiece,
   wherein the first support member has a first contact surface in direct contact with the mold,
   wherein an entire outer periphery of the first contact surface is smaller in an outer dimension than contact surfaces of the mold and the workpiece,
   wherein the first contact surface of the first support member and a second contact surface of the second support member are substantially plane symmetrical to each other with respect to the contact surfaces of the mold and the workpiece, and
   wherein the pressing force is transmitted through the first contact surface between the first support member and the mold, and the second contact surface between the second support member and the workpiece.

6. A semiconductor fabrication method, comprising the step patterning a workpiece using the molding method according to claim 1.

7. A semiconductor fabrication method, comprising the step patterning a workpiece using the molding method according to claim 5.

* * * * *